(12) United States Patent
Haraguchi

(10) Patent No.: US 11,898,915 B2
(45) Date of Patent: Feb. 13, 2024

(54) CIRCUIT ASSEMBLY

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Akira Haraguchi, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 575 days.

(21) Appl. No.: 17/262,511

(22) PCT Filed: Jul. 10, 2019

(86) PCT No.: PCT/JP2019/027277
§ 371 (c)(1),
(2) Date: Jan. 22, 2021

(87) PCT Pub. No.: WO2020/026732
PCT Pub. Date: Feb. 6, 2020

(65) Prior Publication Data
US 2021/0293629 A1    Sep. 23, 2021

(30) Foreign Application Priority Data
Jul. 31, 2018   (JP) .................. 2018-144347

(51) Int. Cl.
*H05K 1/18*     (2006.01)
*G01K 7/01*     (2006.01)
(Continued)

(52) U.S. Cl.
CPC ................. *G01K 7/01* (2013.01); *G01K 1/14* (2013.01); *H05K 1/181* (2013.01); *H05K 1/189* (2013.01);
(Continued)

(58) Field of Classification Search
CPC .......... H05K 1/181; H05K 1/189; H05K 7/06; H05K 2201/10219; H05K 2201/10272
See application file for complete search history.

(56) References Cited

U.S. PATENT DOCUMENTS

2004/0164396 A1   8/2004  Hashimoto
2004/0171914 A1*  9/2004  Avni .................... H05K 3/3436
                                                        600/109
(Continued)

FOREIGN PATENT DOCUMENTS

JP    H9-289281 A       11/1997
JP    2006-237144 A      9/2006

OTHER PUBLICATIONS

International Search Report, Application No. PCT/JP2019/027277, dated Aug. 27, 2019. ISA/Japan Patent Office.

*Primary Examiner* — Hoa C Nguyen
(74) *Attorney, Agent, or Firm* — Honigman LLP

(57) ABSTRACT

A circuit assembly that includes a circuit board, a switching element that is mounted on one side of the circuit board, a folded portion that extends from a peripheral edge portion of the circuit board and is folded towards the one side, and a temperature measuring device that is mounted on the folded portion and is in contact with the switching element.

7 Claims, 7 Drawing Sheets

(51) Int. Cl.
*G01K 1/14* (2021.01)
*H05K 3/34* (2006.01)
*H05K 7/06* (2006.01)

(52) U.S. Cl.
CPC ............ *H05K 3/3405* (2013.01); *H05K 7/06* (2013.01); *H05K 2201/10219* (2013.01); *H05K 2201/10272* (2013.01)

(56) References Cited

U.S. PATENT DOCUMENTS

| | | | |
|---|---|---|---|
| 2004/0190272 A1 | 9/2004 | Takagi et al. | |
| 2005/0116330 A1* | 6/2005 | Murayama | H01L 23/5385 257/730 |
| 2005/0158911 A1* | 7/2005 | Uwada | H01L 23/49833 257/E23.177 |
| 2005/0275088 A1* | 12/2005 | Sakurai | H01L 25/50 257/730 |
| 2007/0230154 A1* | 10/2007 | Nakayama | H01L 25/0657 361/810 |
| 2011/0031628 A1* | 2/2011 | Takada | G11C 5/04 257/773 |
| 2012/0170231 A1* | 7/2012 | Lee | H05K 1/145 29/831 |
| 2012/0261814 A1* | 10/2012 | Slavov | H01L 25/0657 257/737 |
| 2016/0171363 A1* | 6/2016 | Mei | A61B 5/6814 235/492 |
| 2016/0268649 A1* | 9/2016 | Heo | H01M 50/202 |
| 2018/0206340 A1* | 7/2018 | Yamaura | H05K 1/115 |
| 2019/0267312 A1* | 8/2019 | Koller | H01L 23/5386 |

* cited by examiner

CIRCUIT ASSEMBLY

CROSS-REFERENCE TO RELATED APPLICATIONS

This application is the U.S. national stage of PCT/JP2019/027277 filed on Jul. 10, 2019, which claims priority of Japanese Patent Application No. JP 2018-144347 filed on Jul. 31, 2018, the contents of which are incorporated herein.

TECHNICAL FIELD

The present disclosure relates to a circuit assembly.

BACKGROUND

Conventionally, circuit assemblies are installed between power sources and loads in vehicles and control the flow of current from the power sources to the loads. Circuit assemblies include switching elements and control circuits that control the switching on and off of the switching elements. The switching elements are switched on or off based on signals that are input from the control circuits. Circuit assemblies perform the current control mentioned above by switching the switching elements on and off.

In order to prevent the switching elements from operating unstably, becoming damaged, and the like due to overheating, there are cases in which the temperatures of the switching elements are measured by temperature measuring devices. In JP 2006-237144A, temperature measuring devices (thermistors) and switching elements (power MOSFETs) are mounted on the same circuit board, and conduction portions (lands) to which the switching elements whose temperatures are to be measured are attached and conduction portions to which temperature detectors (temperature detection elements) are connected are formed as a single body with the circuit board.

There are cases in which radiators with a large heat capacity are used in circuit assemblies, and in such a case, with the technology of JP 2006-237144A, the conduction of heat from the switching elements to the circuit board becomes weak, the temperature around the temperature detectors does not rise, the temperature of the switching element cannot be reliably measured, and there is concern that abnormal heat production cannot be reliably detected.

An object of the present disclosure is to provide a circuit assembly in which it is possible to reliably measure the temperature of a switching element.

SUMMARY

A circuit assembly according to one aspect of the present disclosure includes: a circuit board; a switching element that is mounted on one side of the circuit board; a folded portion that extends from a peripheral edge portion of the circuit board and is folded towards the one side; and a temperature measuring device that is mounted on the folded portion and is in contact with the switching element, wherein the circuit assembly is provided with a fixing portion for fixing the temperature measuring device and the folded portion to the switching element.

Advantageous Effects of the Disclosure

With the configuration mentioned above, it is possible to reliably measure the temperature of a switching element.

Embodiments of the present disclosure will be listed and described. Also, at least some of the embodiments described below may be freely combined.

A circuit assembly according to one aspect of the present disclosure includes: a circuit board; a switching element that is mounted on one side of the circuit board; a folded portion that extends from a peripheral edge portion of the circuit board and is folded towards the one side; and a temperature measuring device that is mounted on the folded portion and is in contact with the switching element.

With this aspect, the distance between the temperature measuring device and the switching element is reduced, and it is possible to reliably measure the temperature of the switching element.

The circuit assembly according to another aspect of the present disclosure includes a plurality of the switching elements, a plurality of the folded portions, and a plurality of the temperature measuring devices.

With this aspect, it is possible to individually measure the temperatures of a plurality of switching elements.

The circuit assembly according to another aspect of the present disclosure includes a fixing portion that is provided between the temperature measuring device and the switching element.

With this aspect, it is also possible to favorably fix the temperature measuring device to a fixing portion.

In the circuit assembly according to another aspect of the present disclosure, the fixing portion has a thermosetting property.

With this aspect, it is possible to favorably fix the temperature measuring device to the fixing member by embedding the temperature measuring device into the fixing portion prior to heat curing and then heat curing the fixing portion.

The circuit assembly according to another aspect of the present disclosure further includes: an input bus bar that opposes another side of the circuit board and into which power can be input; an output bus bar that opposes the other side of the circuit board and from which power can be output; and a conductive portion that is provided on the circuit board and respectively connects an input terminal and an output terminal of the switching element to the input bus bar and the output bus bar.

With this aspect, it is possible to switch the power input from the input bus bar and output from the output bus bar on and off with use of the switching element.

The following specifically describes the present disclosure with reference to the drawings, which show embodiments thereof.

Figure 1:
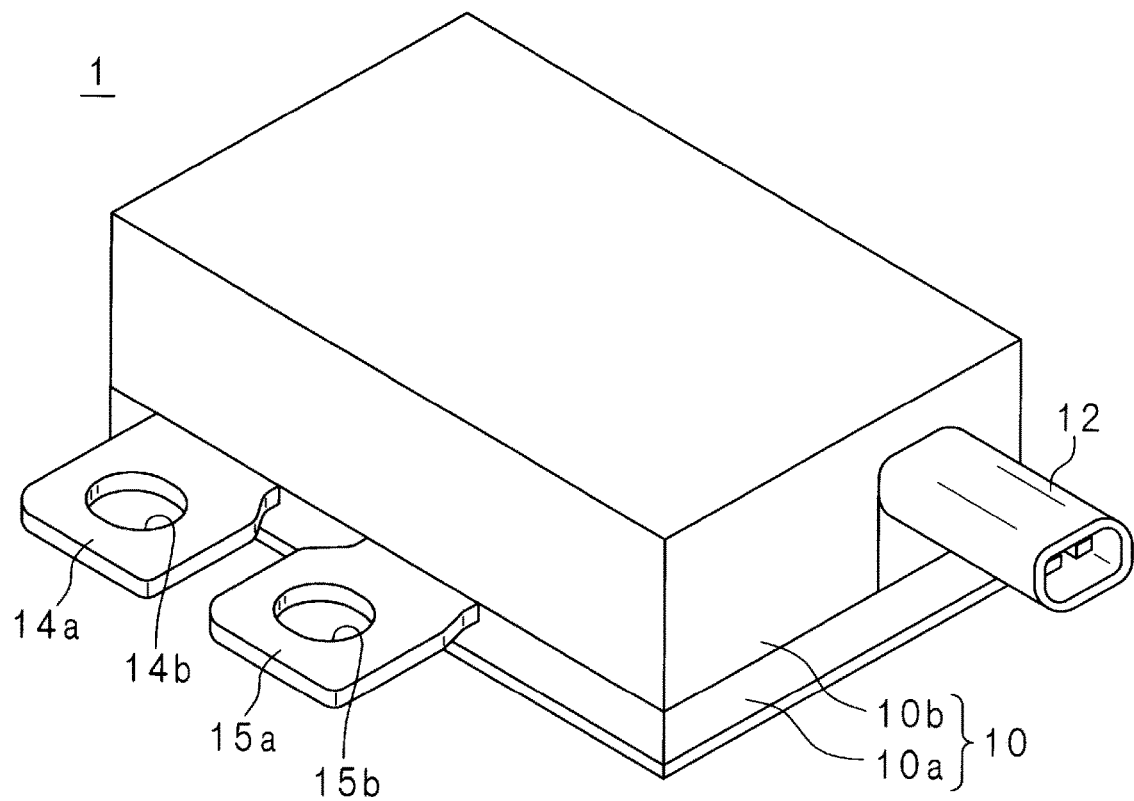
FIG. 1 is an external perspective view of a circuit assembly according to an embodiment.

FIG. 1 is an external perspective view of a circuit assembly according to an embodiment. A circuit assembly 1 is provided with a power supply path between a power source such as a battery included in a vehicle, and a load such as a lamp, a wiper, or a motor.

The circuit assembly 1 includes a housing 10. The housing 10 has a rectangular parallelepiped shape, and includes a flat rectangular shaped body portion and a cover portion 10b that completely covers one side of the body portion 10a.

Figure 2:
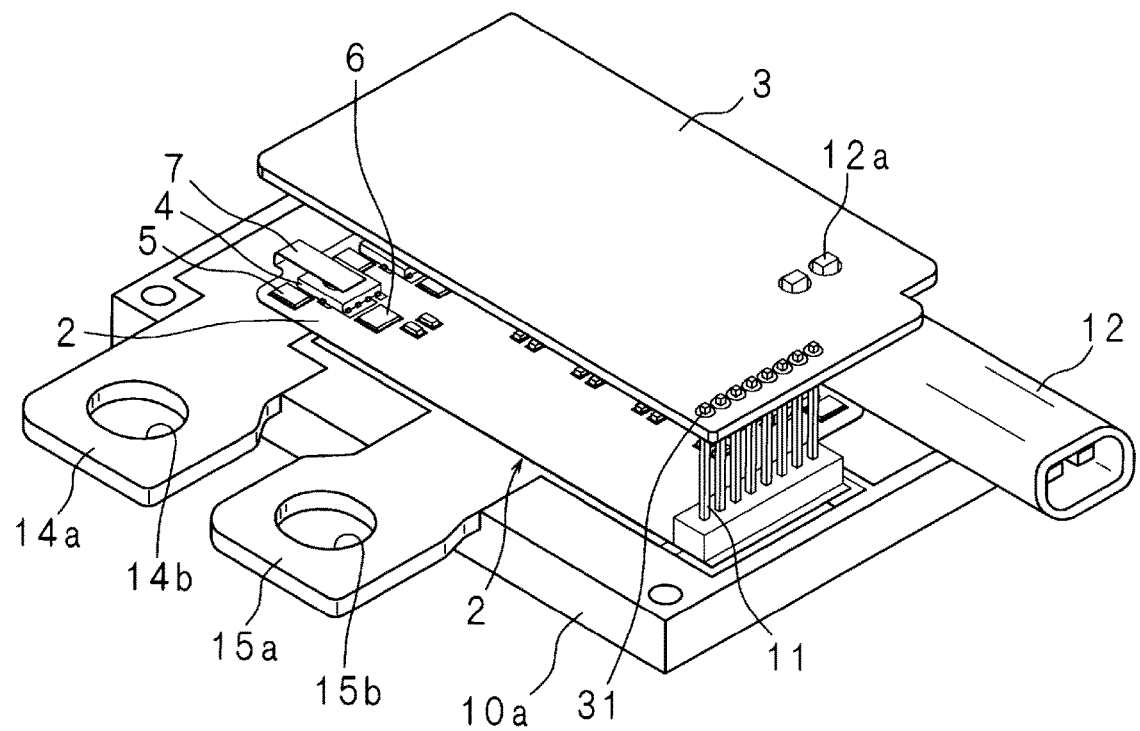
FIG. 2 is a perspective view of the circuit assembly showing a state in which a cover portion has been removed.

FIG. 2 is a perspective view of the circuit assembly showing a state in which a cover portion 10b has been removed. The circuit assembly 1 includes a circuit board 2 and a control board 3. The circuit board 2 may be, for example, an FPC (Flexible Printed Circuit) or the like. The circuit board 2 is mounted with one side opposing the body portion 10a. An electronic component such as an FET (Field Effect Transistor) that will be described later, a conductive piece, or the like is mounted on the circuit board 2.

The control board 3 has a rectangular plate shape and is disposed such that one side thereof opposes a circuit board and the lengthwise direction of the control board 3 is parallel with the lengthwise direction of the circuit board 2. One side of the control board 3 is provided with electronic components such as resistors, coils, capacitors, diodes, and the like, and a control circuit (not shown) that includes a wiring pattern that electrically connects the electronic components.

Pole-shaped pin-and-socket connectors 11 are provided in a standing manner on one short-side portion of the circuit board 2. The circuit board 2 is connected to the control board 3 via the pin-and-socket connectors 11.

A connector 12 has a tubular outer shape, and a plurality of pole-shaped terminal portions 12a are provided inside the connector 12. One end of each of the terminal portions 12a is connected to an external ECU (Electronic Control Unit) via a signal line (not shown). The other end of each of the terminal portions 12a of the connector 12 is connected to the wiring pattern of the control board 3. As shown in FIG. 1, the connector 12 protrudes from the cover portion 10b when the cover portion 10b is attached to the body portion 10a.

Figure 3:
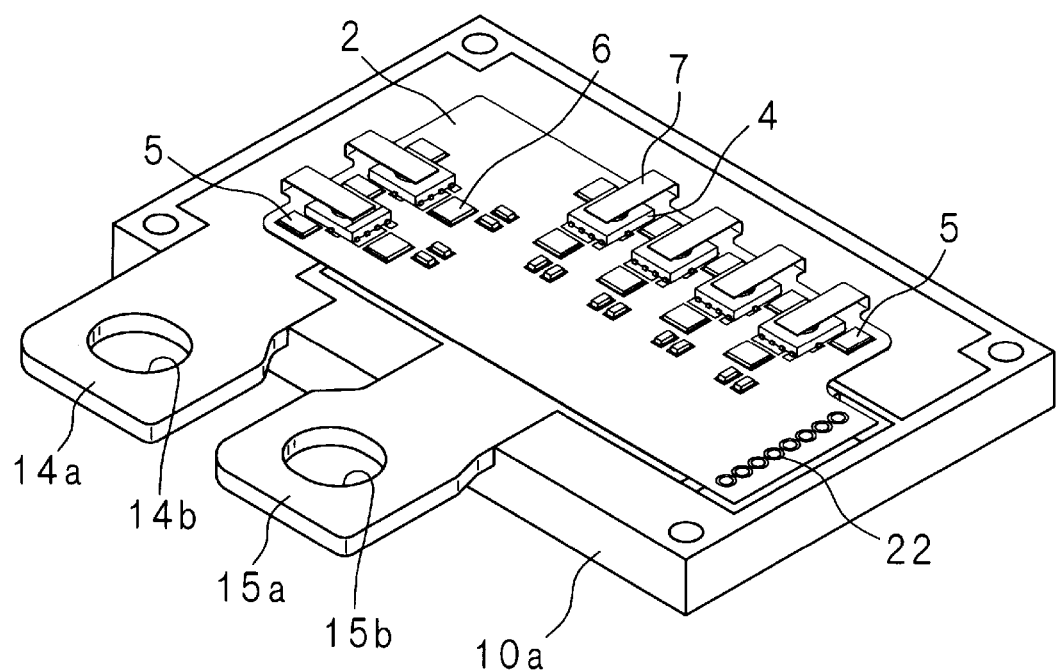
FIG. 3 is a perspective view showing an aspect in which FETs are installed.

FIG. 3 is a perspective view showing an aspect in which FETs are installed. The circuit assembly 1 includes a plurality of FETs 4 (six in the drawings), a plurality of first conductive pieces 5 (eight in the drawings), and a plurality of second conductive pieces 6 (six in the drawings). Note that the numbers of the FETs 4, the first conductive pieces 5, and the second conductive pieces 6 are not limited to the numbers thereof shown in the drawings.

Two FETs 4 are arranged on the other side of the circuit board 2 along the other short-side portion thereof that is opposite to the one short-side portion described above, and four FETs 4 are provided parallel to each other along one long-side portion. One short-side portion of the circuit board 2 is provided with a plurality of parallel through holes 22 to which the pin-and-socket connectors 11 connect.

The first conductive pieces 5 are arranged so as to sandwich the FETs 4, with three of the first conductive pieces 5 arranged along the other short-side portion of the circuit board 2, and five of the first conductive pieces 5 arranged along the one long-side portion of the circuit board 2. Two of the second conductive pieces 6 are arranged along the other short-side portion of the circuit board 2, and four of the second conductive pieces 6 are arranged along one long-side portion of the circuit board 2. Each of the second conductive pieces 6 corresponds to a different FET 4 and is positioned more towards the center of the circuit board 2 than the FETs 4 are. A plurality of chip components are arranged in the periphery of the second conductive pieces 6.

The first conductive pieces 5 and the second conductive pieces 6 are preferably chip-shaped pieces of copper having excellent electrical conductivity and thermal conductivity.

Figure 4:
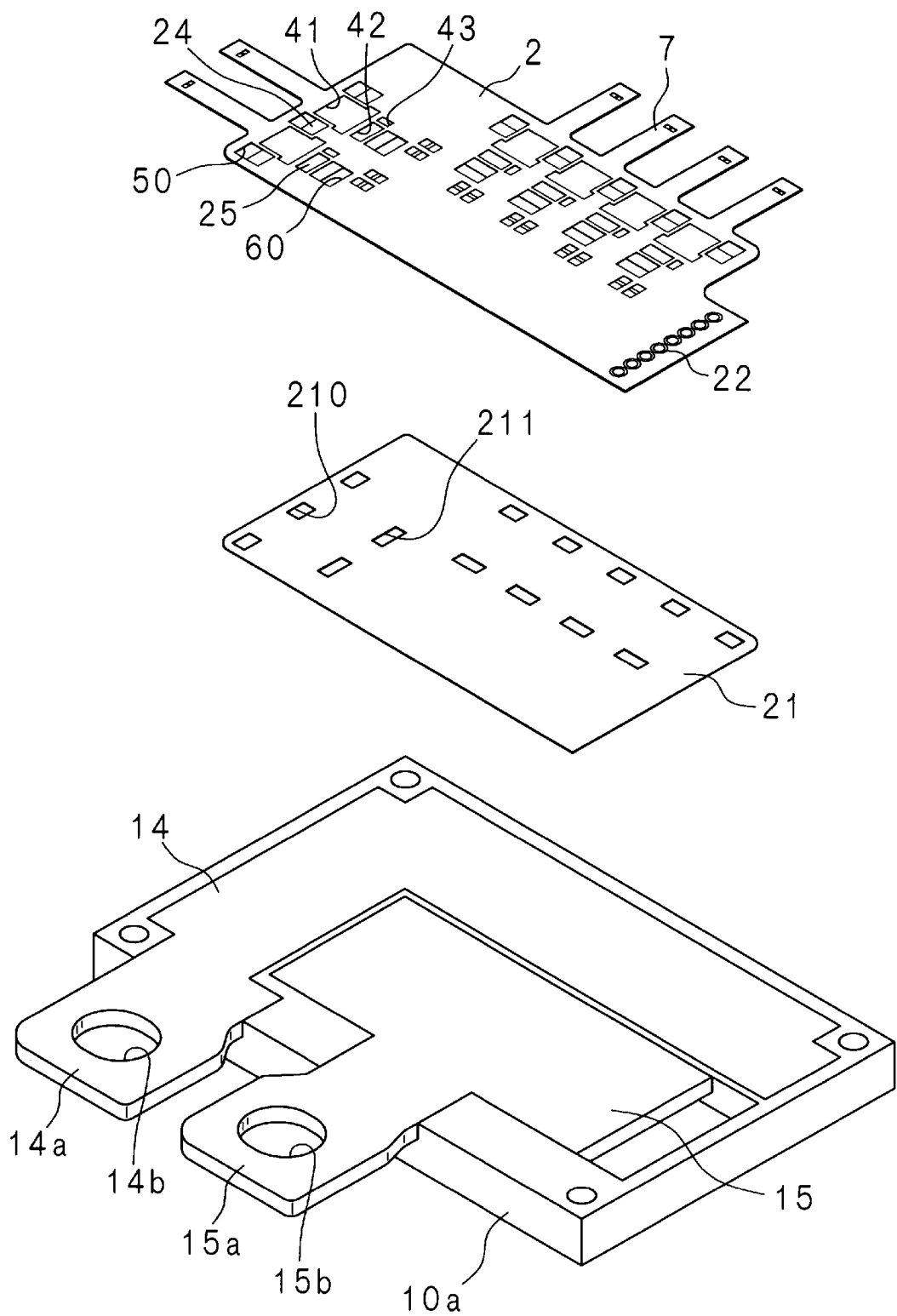
FIG. 4 is a perspective view showing a state in which a circuit board is not mounted.
Figure 5:
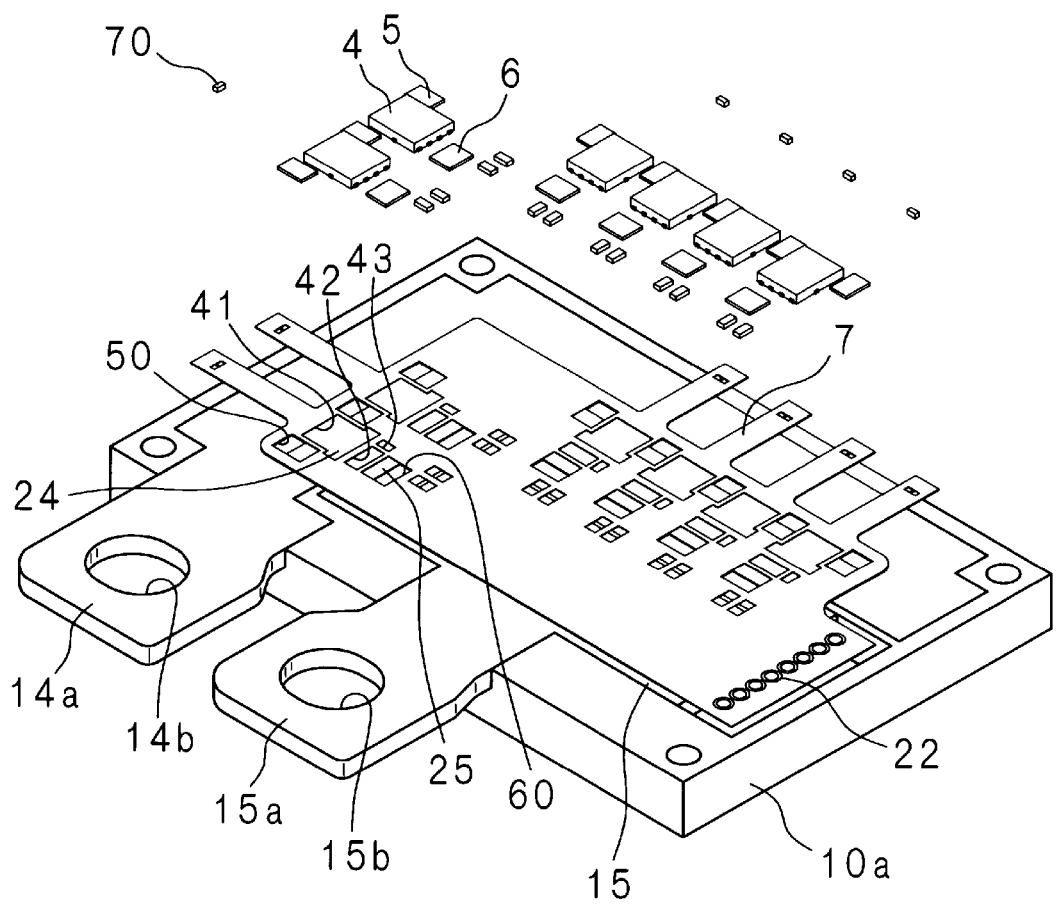
FIG. 5 is a perspective view illustrating the installation of FETs.
Figure 6:
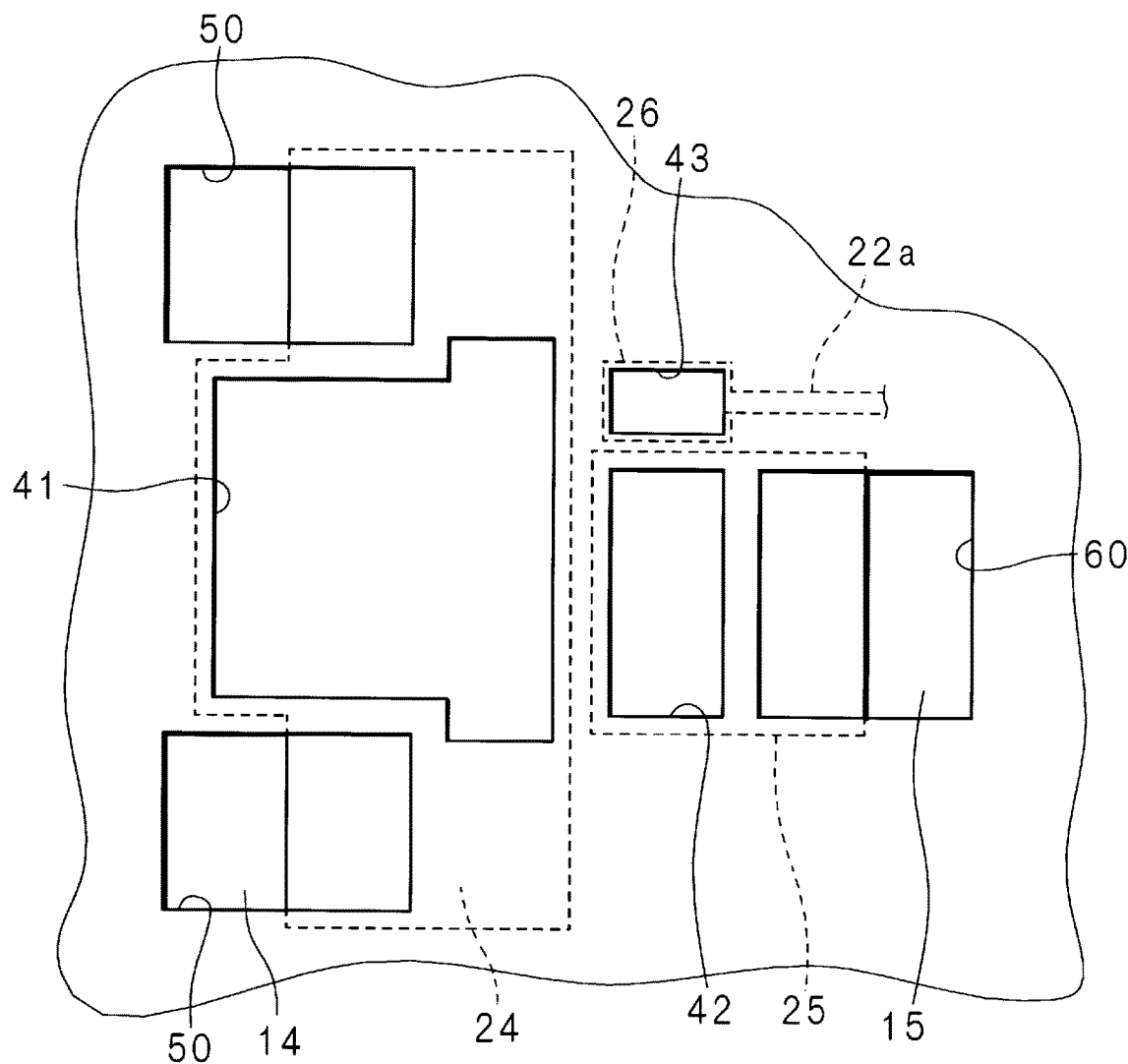
FIG. 6 is a partially enlarged plan view showing a first conductive portion and a second conductive portion.

FIG. 4 is a perspective view showing a state in which the circuit board 2 is not mounted. FIG. 5 is a perspective view illustrating the mounting of the FETs 4. FIG. 6 is a partially enlarged plan view showing a first conductive portion and a second conductive portion.

As shown in FIG. 4, one side of the body portion 10a is provided with a plate-shaped input bus bar 14 and a plate-shaped output bus bar 15, which are flush with each other. The input bus bar 14 is shaped like the letter "L" in a plan view thereof, and the straight portions of the "L" shape are positioned along a long-side portion and a short-side portion of the body portion 10a. One end portion of the input bus bar 14 is continuous with an input terminal 14a, which protrudes from the body portion 10a.

The output bus bar 15 has a rectangular shape and is arranged in a central portion of one side of the body portion 10a. The output bus bar 15 is separated from the input bus bar 14 by a predetermined distance, such that the lengthwise direction of the output bus bar 15 is parallel with the lengthwise direction of the body portion 10a. The output bus bar 15 is continuous with an output terminal 15a that is provided in a central portion of the long-side of the output bus bar 15, and protrudes from the body portion 10a.

The input bus bar 14 and the output bus bar 15, as well as the input terminal 14a and the output terminal 15a, have a plate thickness of 2 mm and are formed by bus bar members whose surface layer has been subjected to nickel plating.

Holes 14b and 15b are respectively provided passing through the input terminal 14a and the output terminal 15a in the thickness direction thereof, and the power source and the load are connected to each other by bolts (not shown) that are inserted into the holes 14b and 15b. The input terminal 14a can be connected to the power source, and the output terminal 15a can be connected to the load.

The body portion 10a is insert-molded with the use of an insulating resin material such as, for example, a phenol resin, a glass epoxy resin, or the like. A resin molded body is molded from an insulating resin material and is bonded to the input terminal 14a, the output terminal 15a, the input bus bar 14, and the output bus bar 15 to create a single body. Also, the resin molded body is arranged between the input terminal 14a and the output terminal 15a, as well as between the input bus bar 14 and the output bus bar 15, and provides insulation therebetween.

Also, the circuit board 2 is adhered to the body portion 10a by an insulating adhesive sheet 21 that has high thermal conductivity and has a rectangular shape as shown in FIG. 4.

First openings 41, second openings 42, and third openings 43 are provided passing through the circuit board 2 at positions corresponding to the FETs 4. The second openings 42 and the third openings 43 are positioned more towards the center of the circuit board 2 than the first openings 41 are, and are lined up along the lengthwise direction and the widthwise direction of the circuit board 2. The first openings 41 are larger than the second openings 42 and the third openings 43, and the second openings 42 are larger than the third openings 43.

Also, fourth openings 50 are provided passing through the circuit board 2 at positions corresponding to the first conductive pieces 5. Furthermore, fifth openings 60 are provided passing through the circuit board 2 at positions corresponding to the second conductive pieces 6. The fifth openings 60 and the first openings 41 are positioned sandwiching the second openings 42.

One side of the circuit board 2 is provided with rectangular first conductive portions 24 at positions corresponding to the first openings 41 and the fourth openings 50. The first conductive portions 24 are exposed on the other side of the circuit board 2 from the whole of the first openings 41 and are exposed on the other side of the circuit board 2 from the halves of the fourth openings 50 that are located towards the center of the circuit board 2. Note that if exposed in the manner described above, the first conductive portions may also be shaped like the letter "L" corresponding to all of the first openings 41 and the fourth openings 50, or may also be provided for each of the first openings 41 and the fourth openings 50.

The circuit board 2 is provided with rectangular second conductive portions 25 at positions corresponding to the second openings 42 and the fifth openings 60. The second conductive portions 25 are exposed on the other side of the circuit board 2 from the whole of the second openings 42 and are exposed on the other side of the circuit board 2 from the halves of the fifth openings 60 that are located towards the outer side of the circuit board 2. Furthermore, one side of the circuit board 2 is provided with land portions 26 at positions corresponding to the third openings 43, and these land portions 26 are exposed on the other side of the circuit board 2 from the whole of the third openings 43. Also, one side of the circuit board 2 is provided with connection portions 22a that electrically connect the land portions 26 and the through holes 22. The first conductive portions 24, the second conductive portions 25, the land portions 26, and the connection portions 22a may be formed from a copper foil, for example.

First holes 210 and second holes 211 are provided passing through the adhesive sheet 21 at positions corresponding to the fourth openings 50 and the fifth openings 60 of the circuit board 2. The first holes 210 correspond to the half of the fourth openings 50 that are located towards the outer side of the circuit board 2, and the second holes 211 correspond to the half of the fifth openings 60 that are located towards the center of the circuit board 2.

The circuit board 2 and the adhesive sheet 21 are superimposed over one side of the body portion 10a such that the one side provided with the circuit pattern of the circuit board 2 including the first conductive portions 24, the second conductive portions 25, the land portions 26, and the connection portions 22a is positioned towards the adhesive sheet 21. The first holes 210 are continuous with the fourth openings 50, and do not overlap the first conductive portions 24. Also, the second holes 211 are continuous with the fifth openings 60, and do not overlap the second conductive portions 25.

As shown in FIG. 6, portions of the input bus bar 14 are exposed from the fourth openings 50 and the first holes 210, and portions of the output bus bar 15 are exposed from the fifth openings 60 and the second holes 211.

For the circuit board 2, a polyimide or the like is used as a base material and is provided with a pattern that includes the conductive portions and the like, formed on one side through etching and has an insulating cover film attached thereto. A 35 μm copper foil, for example, may be used as the first conductive portions 24, the second conductive portions 25, the land portions 26, and the connection portions 22a. The conductive pieces may be made of pure copper or a copper alloy having a thickness of 0.2 to 0.5 mm, for example, and the surfaces of the conductive pieces may be plated with tin, nickel, or the like.

Figure 7:
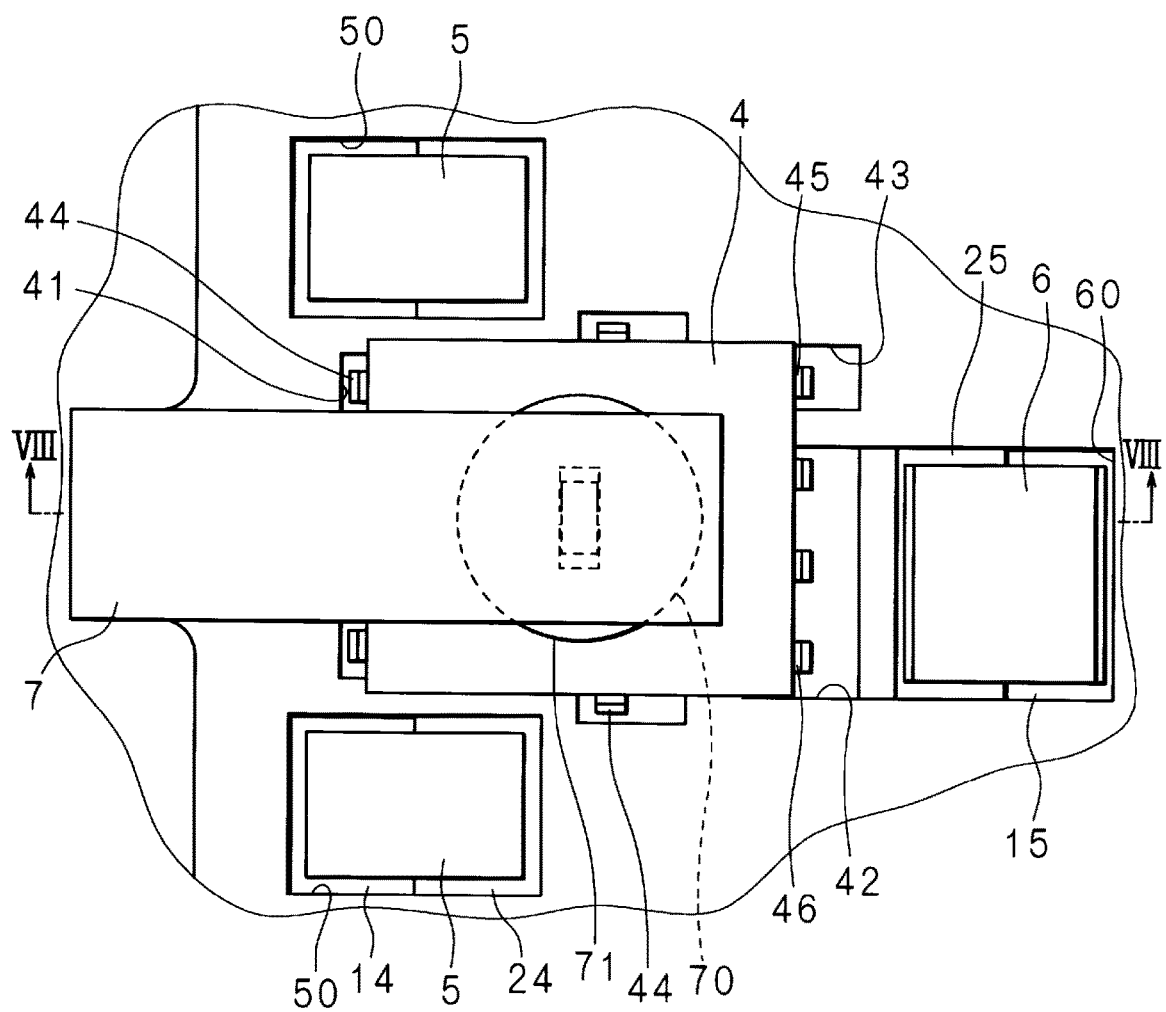
FIG. 7 is a partially enlarged plan view showing an aspect in which a thermistor is installed.
Figure 8:
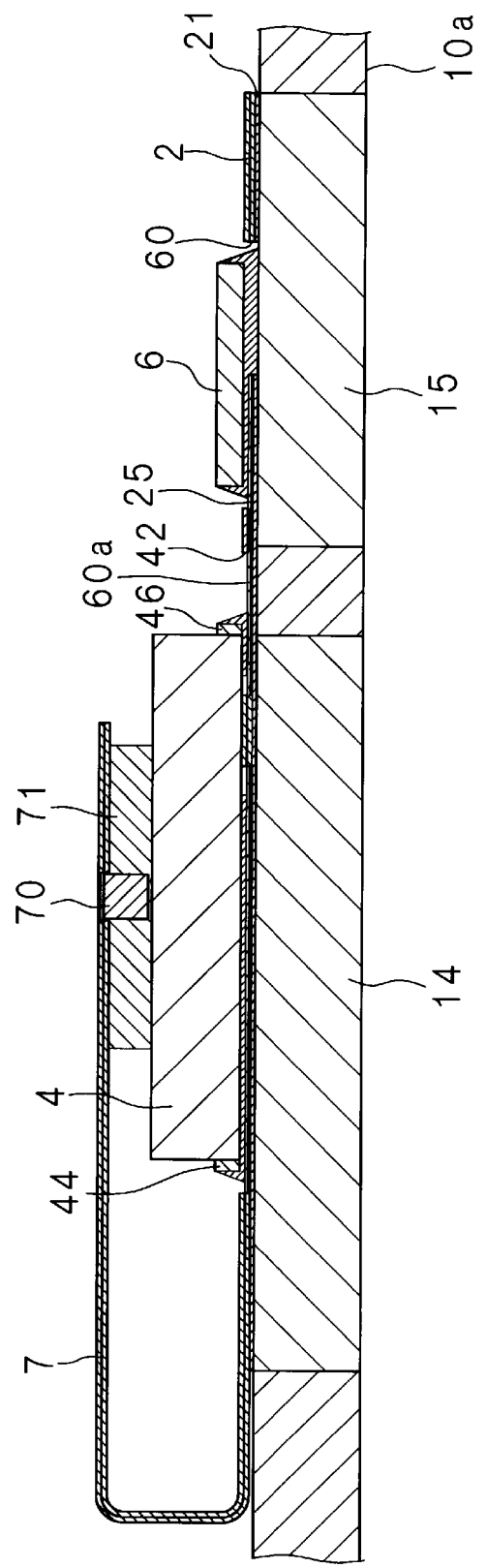
FIG. 8 is a sectional view taken along a line VIII-VIII in FIG. 7.

FIG. 7 is a partially enlarged plan view showing an aspect in which a thermistor 70 is installed. FIG. 8 is a sectional view taken along a line VIII-VIII in FIG. 7.

Each FET 4 has a rectangular parallelepiped shape and includes four drain terminals 44 that protrude from one side wall and the two side walls that are continuous with the one side wall, and one gate terminal 45 and three source terminals 46 that protrude from a side wall opposite to the one side wall.

The FETs 4 are arranged straddling the first openings 41 to the third openings 43. The drain terminals 44 are soldered to the first conductive portions 24 in the first openings 41, the gate terminals 45 are soldered to the land portions 26 in the third openings 43, and the source terminals 46 are soldered to the second conductive portions 25 in the second openings 42.

The first conductive pieces 5 are arranged straddling the input bus bar 14 and the first conductive portions 24 in the fourth openings 50, all of which are connected to each other through soldering. The second conductive pieces 6 are arranged straddling the output bus bar 15 and the second conductive portions 25 in the fifth openings 60, all of which are connected to each other through soldering.

A soldering paste, for example, may be applied to the first conductive portions 24 and the second conductive portions 25 to arrange and mount the FETs 4, the first conductive pieces 5, and the second conductive pieces 6 with the use of reflow soldering.

Here, it is preferable that the adhesive sheet 21, for example, contains a thermally conductive filler and an adhesive is used that is highly resistant to heat, such as an acrylic or silicone adhesive. In this way, heat generated by the FETs 4 can be transmitted and dissipated to a bus bar, and it is also possible to increase the heat resistance of the adhesive sheet 21 during reflow soldering.

The circuit board 2 is provided with folded portions 7 at positions that correspond to the first openings 41. The thermistors 70 are attached to the extending end portions of the folded portions 7. The folded portions 7 extend perpendicular from the short-side portion or long-side portion of the circuit board 2, and are folded so that the extending end portions of the folded portions 7 abut the FETs 4. FIGS. 4 and 5 show a state prior to the folded portions 7 being folded.

The temperatures of the FETs 4 can be individually measured with the thermistors 70. The thermistors 70 are connected to the through holes 22 via a circuit pattern (not shown) that is formed by the copper foil of the circuit board 2. Note that the thermistor 70 is an example of a temperature measuring device, and a temperature measuring device other than the thermistor 70 may also be used, such as a semiconductor temperature sensor or the like.

Also, after the FETs 4 are attached, the folded portions 7 of the circuit board 2 are folded at the base end portion sides thereof, and the extending end portions of the folded portions 7 abut the upper surfaces of the FETs 4. The thermistors 70 provided on the extending end portions of the folded portions 7 are sandwiched between the folded portions 7 and the FETs 4, and are fixed to the upper surfaces of the FETs 4 by being embedded into fixing portions 71 that are positioned between the folded portions 7 and the FETs 4.

The fixing portions 71 are formed from a thermo-settable silicone composition that contains a thermally conductive filler, for example. The FETs 4 are coated with the fixing portion 71 in a gelatinous state before the upper surfaces of the FETs 4 are subjected to thermosetting, and the folded portions 7 are folded to embed the thermistors 70 into the fixing portions 71. Then, the thermistors 70 are fixed to the FETs 4 due to the fixing portions 71 being subjected to thermosetting.

With the configuration described above, the gate terminals 45 of the FETs 4 are connected to the control board 3 via the land portions 26, the connection portions 22a, the through holes 22, and the pin-and-socket connectors 11. Thus, signals from the control board 3 based on signals from an external ECU are input into the FETs 4. The FETs 4 are switched on and off based on the signals from the control board 3. The drain terminals 44 and the source terminals 46 are brought into conduction and the FETs 4 are switched on by a predetermined voltage being applied to the gate terminals 45.

Also, the drain terminals 44 of the FETs 4 are connected to the input bus bar 14 via the first conductive portions 24 and the first conductive pieces 5. The source terminals 46 of the FETs 4 are connected to the output bus bar 15 via the second conductive portions 25 and the second conductive pieces 6.

Accordingly, if the FETs 4 are switched on by a signal being input from the control board 3, power supplied from the input terminal 14a is output from the output terminal 15a via the output bus bar 15 via the first conductive portions 24, the first conductive pieces 5, the drain terminals 44 and the source terminals 46 of the FETs 4, and the second conductive portions 25 and the second conductive pieces 6. In this way, power is supplied from the power source to the load via the circuit assembly 1.

If the FETs 4 are switched off by a signal being input from the control board 3, the drain terminals 44 and source terminals 46 of the FETs 4 are not conductive with each other, and the supply of power from the power source to the load is stopped.

Furthermore, the thermistors 70 are connected to the control board 3 via a circuit pattern of the circuit board 2, the through holes 22, and the pin-and-socket connectors 11. In this way, signals pertaining to the temperatures measured by the thermistors 70 can be input into the control board 3. Accordingly, the control board 3 can detect whether or not the FETs 4 are overheating based on the signals from the thermistors 70. If the FETs 4 are overheating, the control board 3 can switch the FETs 4 off and stop the FETs 4 overheating.

With the configuration described above, the thermistors 70 are fixed to the upper surfaces of the FETs 4, and therefore it is possible to reduce the distances between the thermistors 70 and the FETs 4 and measure the temperatures of the FETs 4 more reliably than an aspect such as measuring the temperature around the FETs 4. In this way, it is possible to determine whether or not the FETs 4 are overheating if the temperatures of the FETs 4 rise to or above a predetermined threshold temperature. Also, the thermistors 70 are embedded into and fixed to the fixing portions 71, and can therefore be more reliably fixed.

The embodiments disclosed herein are illustrative in all respects and should not be considered restrictive. The scope of the disclosure is indicated by the claims, not by the meanings described above, and is intended to include all changes within the meaning and scope of the claims that are equal to the claims

The invention claimed is:

1. A circuit assembly, comprising:
   a circuit board;
   a switching element that is mounted on one side of the circuit board;
   a folded portion that extends from a peripheral edge portion of the circuit board and is folded towards the one side; and
   a temperature measuring device that is mounted on the folded portion and is in contact with the switching element,
   wherein the circuit assembly is provided with a fixing portion for fixing the temperature measuring device and the folded portion to the switching element.

2. The circuit assembly according to claim 1, wherein there are a plurality of the switching elements, a plurality of the folded portions, and a plurality of the temperature measuring devices.

3. The circuit assembly according to claim 2, wherein the fixing portion has a thermosetting property.

4. The circuit assembly according to claim 2, further comprising:
   an input bus bar that opposes another side of the circuit board and into which power can be input;
   an output bus bar that opposes the other side of the circuit board and from which power can be output; and
   a conductive portion that is provided on the circuit board and respectively connects an input terminal and an output terminal of the switching element to the input bus bar and the output bus bar.

5. The circuit assembly according to claim 1, wherein the fixing portion has a thermosetting property.

6. The circuit assembly according to claim 5, further comprising:
   an input bus bar that opposes another side of the circuit board and into which power can be input;
   an output bus bar that opposes the other side of the circuit board and from which power can be output; and
   a conductive portion that is provided on the circuit board and respectively connects an input terminal and an output terminal of the switching element to the input bus bar and the output bus bar.

7. The circuit assembly according to claim 1, further comprising:
   an input bus bar that opposes another side of the circuit board and into which power can be input;
   an output bus bar that opposes the other side of the circuit board and from which power can be output; and
   a conductive portion that is provided on the circuit board and respectively connects an input terminal and an output terminal of the switching element to the input bus bar and the output bus bar.

* * * * *